(12) United States Patent
Visconti (10) Patent No.: US 6,654,287 B2
(45) Date of Patent: Nov. 25, 2003

(54) METHOD OF RE-PROGRAMMING AN ARRAY OF NON-VOLATILE MEMORY CELLS, IN PARTICULAR OF THE NOR ARCHITECTURE FLASH TYPE, AFTER AN ERASE OPERATION, AND A CORRESPONDING MEMORY DEVICE (75) Inventor: Angelo Visconti, Appiano Gentile (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/171,078

(22) Filed: Jun. 12, 2002

(65) Prior Publication Data

US 2002/0186594 A1 Dec. 12, 2002

(30) Foreign Application Priority Data

Jun. 12, 2001 (IT) ...................... MI2001A1232

(51) Int. Cl.$^7$ ........................ G11C 16/06; G11C 16/04
(52) U.S. Cl. ........................ 365/185.22; 365/185.29; 365/185.33
(58) Field of Search .................. 365/185.22, 185.29, 365/185.33

(56) References Cited

U.S. PATENT DOCUMENTS

| | | | | |
|---|---|---|---|---|
| 5,943,266 A | * | 8/1999 | Ogura et al. | ............ 365/185.22 |
| 6,055,187 A | * | 4/2000 | Dallabora et al. | ...... 365/185.22 |
| 6,519,183 B2 | * | 2/2003 | Visconti | ................ 365/185.22 |

* cited by examiner

*Primary Examiner*—Trong Phan
(74) *Attorney, Agent, or Firm*—Lisa K. Jorgenson; Allen, Dryer, Doppelt, Milbrath & Gilchrist, P.A.

(57) ABSTRACT

A method of re-programming an array of non-volatile memory cells after an erase operation is provided where a re-program operation is executed to restore a threshold voltage of the memory cells to a higher value than a depletion verify voltage value. The method may include identifying a first value of the depletion verify voltage, executing the re-program operation using the value of the depletion verify voltage, and verifying the array of re-programmed cells for reliability in a read mode. If the outcome of the verifying step is favorable, the re-program operation is terminated as successful. Otherwise, the value of the depletion verify voltage is modified, and the re-program operation is again executed using the modified value of the depletion verify voltage as adjusted for the actual operating conditions of the memory array.

18 Claims, 5 Drawing Sheets

METHOD OF RE-PROGRAMMING AN ARRAY OF NON-VOLATILE MEMORY CELLS, IN PARTICULAR OF THE NOR ARCHITECTURE FLASH TYPE, AFTER AN ERASE OPERATION, AND A CORRESPONDING MEMORY DEVICE

FIELD OF THE INVENTION

The present invention relates to the field of memory devices, and, more particularly, to a method of re-programming an array of non-volatile memory cells after an erase operation.

BACKGROUND OF THE INVENTION

As is known, a non-volatile memory retains information stored therein when no power is supplied to it. It is usually set up as an array of memory cells including a plurality of rows and columns.

In particular, in NOR architecture Flash type non-volatile memories, individual memory cells may be selectively programmed (i.e., brought to a logic level 0), and the array may be erased (i.e., brought to a logic level 1). Either the whole array or subarrays (or sectors), which typically have a size of 512 k cells, may be erased.

To store logic information in a non-volatile manner, the state of an elementary memory cell is changed by having the electric charge contained in a floating gate electrode altered by special physical mechanisms. On the other hand, to read stored information, i.e., recognize the state of the memory cell, a value of a current Icell flowing through the column that includes the cell to be read is measured.

Figure 1:
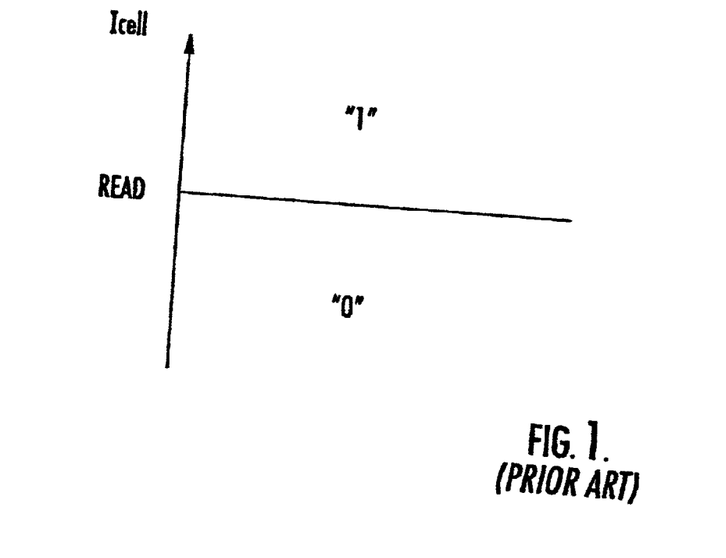
FIG. 1 is a graph illustrating the state of a non-volatile memory cell during a read operation according to the prior art.

In particular, as shown schematically in FIG. 1, when the current Icell is smaller than a suitable reference Read (known as the read reference), the cell is recognized to be in the logic 0 state, or the logic 1 state in the opposite case. In the case of a Flash memory device, an erase operation requires that all the cells in at least one sector be brought to the logic 1 state. A Flash memory device user executes the operation by simply entering a specific command.

Nonetheless, as technology has progressed, the operation of erasing a Flash memory device has grown to become more and more sophisticated and complex. However, this development of the erase operation is not visible to the user, because the increased sophistication and complexity is handled inside the Flash memory devices by on-board "intelligence" provided in continually expanding quantities. In other words, it can be said that the erase operation has been made ever simpler, as seen from the user's point of view, since the first generation of Flash memories, although the underlying operations have become more complex.

To execute the erase operation, a series of voltage pulses are applied to the memory cells inside the Flash memory device so that electrons may be extracted from the floating gate by the tunnel effect. In general, each voltage pulse is followed by a verification operation to verify the memory cells' status to determine if the cells are in the desired logic 1 state.

As noted above, the logic 1 state corresponds to a cell reading current Icell that is larger than the reference value Read, or it may correspond to a cell threshold value Vread that is below a given value Vev, known as the erase verify level. Similarly, a threshold value Vpv, known as the program verify level, is used for a cell verifying operation after a program operation. The erase pulses are repeatedly applied to a cell until the condition for the threshold voltage of a cell is met, i.e., until:

$$V_{th} < V_{ev}. \quad (1)$$

Figure 2:
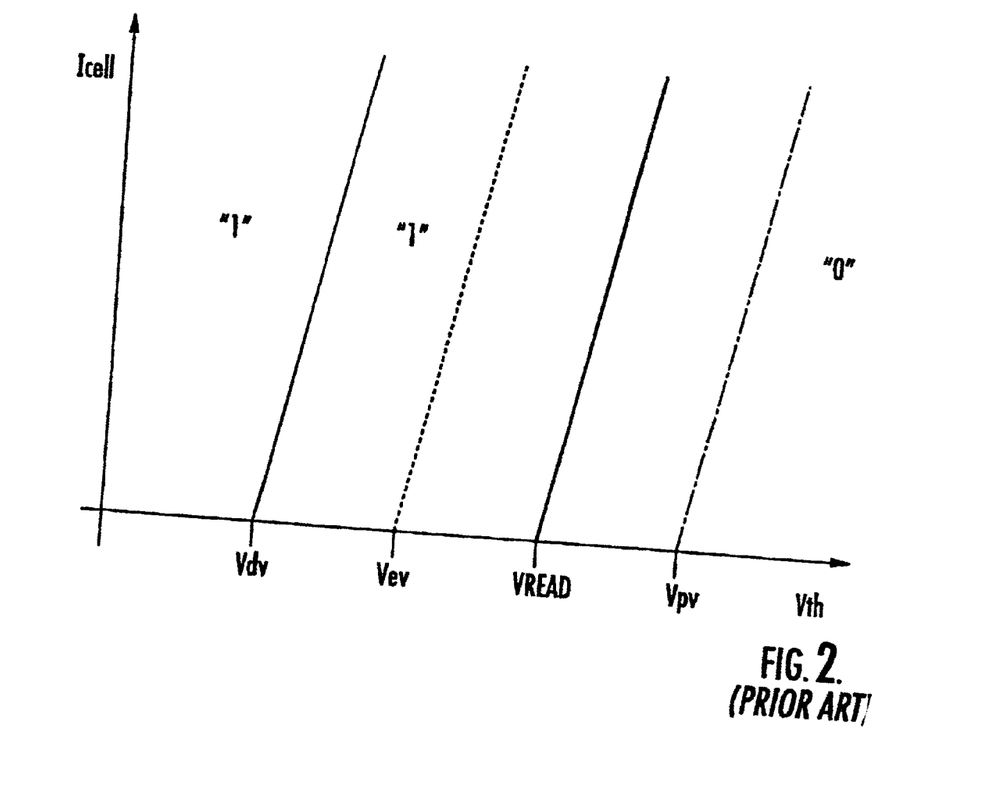
FIG. 2 is a graph plotting current of a non-volatile memory cell after an erase operation according to the prior art.
Figure 3:
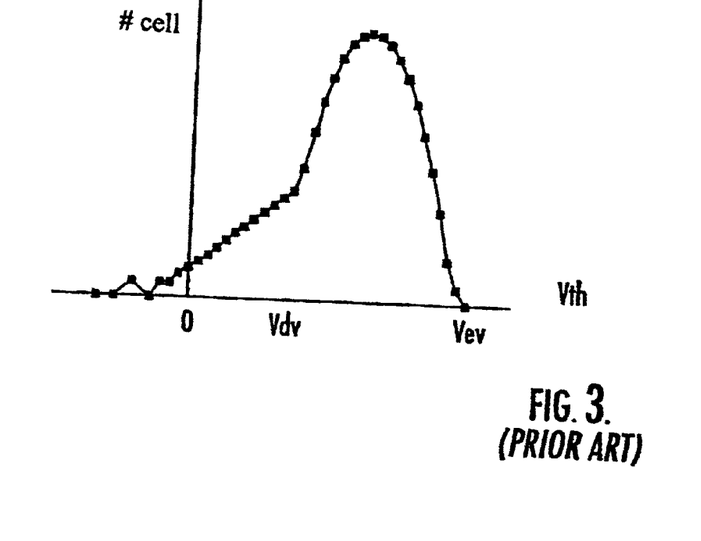
FIG. 3 is a graph illustrating (on a logarithmic scale) a threshold voltage spread for a plurality of non-volatile memory cells after an erase operation according to the prior art.

With Flash memory devices, the erase operation is carried out within at least one sector until the cell with the highest threshold in the array or the sector (known as the "slow" cell) is recognized to be at logic 1. It should be noted that, since the erase operation is a non-selective one, even cells that have already been identified as being at logic 1 would be erased, thus attaining lower, and occasionally much lower (a few Volts), threshold values than the erase verify level Vev, as shown schematically in FIGS. 2 and 3.

However, to correctly read the information stored in a NOR architecture array of memory cells, it is necessary that, as a voltage of 0 Volt is applied to the array rows, all the cells in the memory array are turned "off", i.e., that the drain current of all the cells is smaller than the read current by at least 4–5 orders of magnitude. It should be noted that a voltage of 0 Volts corresponds to the voltage value of the unselected rows of cells during normal operation of the memory device, as well as to the voltage value of the unselected rows with the memory device in the read mode.

From the standpoint of the threshold voltage Vth of the memory cells, a reading operation is correct when no cell in the array has a lower threshold than a suitable value Vdv, known as the depletion verify level. Thus, the spread of the cell threshold voltage Vth in a Flash memory device, following an erase operation, should not be an arbitrary one but instead meet the following requirements if the NOR architecture memory array is to perform correctly in the read mode. These requirements are that it should be less than the erase verify value Vev to ensure the logic 1 state, and it should be more than the depletion verify voltage value Vdv to ensure correct reading.

Figure 4:
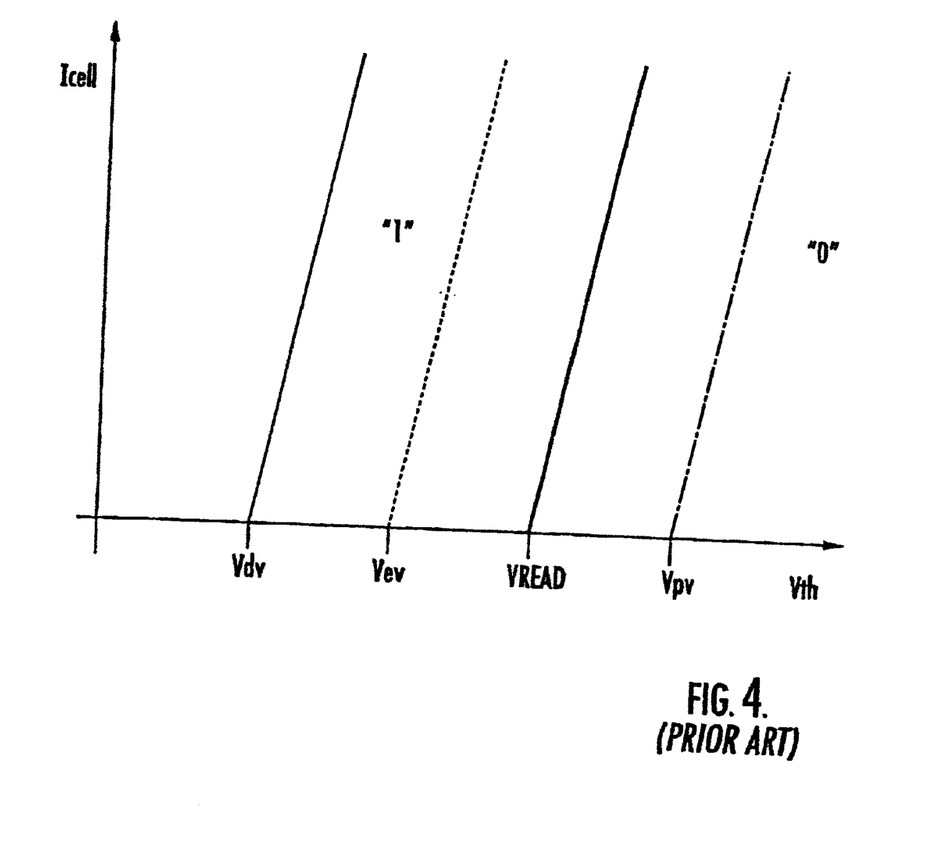
FIG. 4 is graph plotting current of a non-volatile memory cell after a soft program operation according to the prior art.

In other words, the threshold voltage Vth of the erased cells should be within the following range:

$$V_{dv} < V_{th} < V_{ev}, \quad (2)$$

as schematically shown in FIG. 4.

To summarize, to avoid possible malfunctioning in the read mode of the Flash memory device, upon completion of an erase operation, the highest threshold cell should be correctly identified as being at logic 1. Further, the lowest threshold cells should produce substantially no parasitic currents in the columns of the NOR array.

In first-generation Flash memories, these conditions were usually met by a suitably set erase verify value Vev, and by the erase operation being limited to just the step of applying voltage pulses and verifying the logic 1 state of the cells. In later generations, the erase verify point (i.e., the erase verify value Vev) was gradually set at lower values by reason of the shift. That is, it was first set toward single supply and then toward low and very low voltage applications, and more recently, to provide multi-level memories.

In addition, the threshold spread of the memory cells upon completion of an erase operation may undergo variations from factors such as process handling, the erase mode selected, occasional errors in the conduction characteristics of tunnel dielectrics, and device aging in terms of program/erase cycles (hereinafter, P/E cycles). As such, in view of these and other considerations of current memories, and even more so in view of future generations of non-volatile memories, a memory cell array may not be in a condition to perform reliably at the end of an erase operation.

Figure 5:
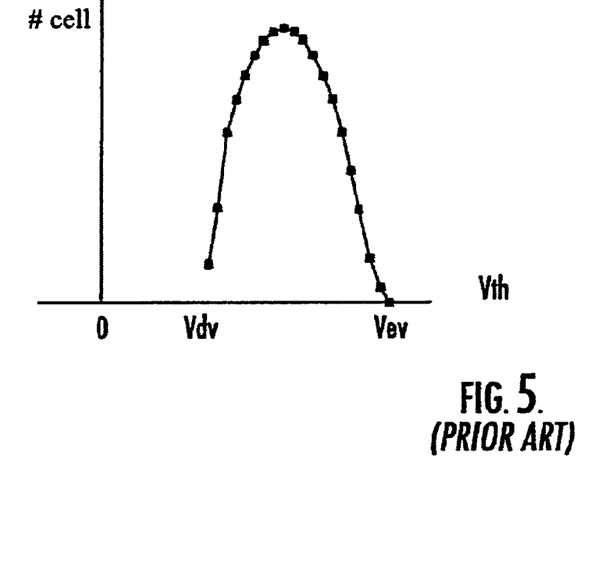
FIG. 5 is a graph illustrating (on a logarithmic scale) a threshold voltage spread for a plurality of non-volatile memory cells after a soft program operation according to the prior art.

When the threshold spread of the cells exceeds the limits set by the range (2) above (FIG. 3), a common practice has been to consolidate the erase operation with a subsequent re-program operation. That is, those cells which have a threshold that is too low are brought up to a value above the depletion verify value Vdv, while still below the erase verify value Vev, as shown schematically in FIGS. 4 and 5.

This re-program operation following an erase operation should be a "slight" one, which is generally known as soft programming. This operation is set apart from the true program operation that brings the cell to the logic 0 state and is carried out upon a specific command from a memory user in that the soft programming operation is performed automatically by the memory device at the end of a true erase operation. It is, therefore, not visible to the user. As previously stated, during a soft program operation, all those memory cells which have their threshold below the depletion verify level Vdv are programmed until they overcome this reference value.

Current re-programming procedures or algorithms provide for a series of program pulses at increasing gate voltage to be applied to the individual cells in a sector. The starting voltage should be suitably low to satisfy two conditions, namely that the charge pumps in the generating circuit of the re-programming voltage should not be overloaded, and the cells should not be programmed beyond the erase verify value Vev.

Before those cells which have their threshold below the depletion verify value are selectively re-programmed, a number of low-voltage gate pulses are sometimes applied to all the cells in a sector. In other cases, depending on the re-programming algorithm being used, it is necessary, or at least safer in terms of reliability, to apply the re-programming pulses to all the cells in one column.

Therefore, the design of a Flash memory preferably allows re-programming of the memory cells under widely varying operational conditions that are dependent on the pattern of the threshold spread after an erase operation, as well as on the parasitic currents produced in the cell columns from applying erase pulses, on the operating temperature, on the age of the memory device, and on the alteration of the conduction characteristics induced by the tunnel effect in the oxides. Furthermore, with respect to the performance of the memory device in terms of time needed to execute the erase operation, an ideal target would be to remove all need to have any cells re-programmed, and hence, any depletion verify value Vdv to be set. Yet, in reality, this is not possible for the reasons set forth above.

Thus, an ideal setting of the depletion verify value Vdv is the lowest value consistent with the need to have the device perform as designed. In actual practice, however, the depletion verify value Vdv that is an ideal value for a new device (i.e. one having zero P/E cycles) will no longer be ideal for the same device once aged (i.e., after thousands or tens of thousands of P/E cycles), or if operated at a different temperature.

Consequently, to provide memory devices of lasting reliability, the depletion verify value Vdv is typically set at the highest of all the "ideal" values under the different operational conditions of the memory device. For example, a depletion verify value Vdv can be used with a Flash memory in a hard-disk application which will correspond to that required for the memory to perform correctly after 100,000 P/E cycles at a running temperature of 120° C.

In other words, since the appropriate depletion verify value Vdv varies with the memory device conditions, it is factory set such that it will ensure proper performance of the device under the most severe of its expected conditions of use. However, this single initial setting is likely to later complicate the re-program operation from the first cycles of the memory device. In addition, many such devices may never have to face conditions that warrant a depletion verify value Vdv selected for worst case.

SUMMARY OF THE INVENTION

The underlying technical problem of this invention is to provide a method of re-programming a non-volatile memory, such as a NOR architecture flash memory, after an erase operation, and a related memory device which overcome the limitations and shortcomings of the prior art noted above.

Generally speaking, the present invention provides a method of re-programming a memory after an erase operation, based on dynamically, or adaptively, handling the setting of the depletion verify value. As such, the above-noted technical problem is addressed in accordance with the present invention by a method of re-programming an array of non-volatile memory cells subsequent to an erase operation where a re-program operation is executed after the erase operation to restore a threshold voltage of the memory cells to a higher value than a depletion verify value.

More particularly, the method may include identifying a first value of the depletion verify voltage, executing the re-program operation using the value of the depletion verify voltage (Vdv), and verifying the array of re-programmed cells for reliability in the read mode. Further, if the outcome of the verifying step is favorable, program operation may be ended. Otherwise, the value of the depletion verify voltage may be modified, and the re-program operation again executed using the modified value of the depletion verify voltage, as automatically adjusted based upon the operating conditions of the memory array.

A non-volatile memory device in accordance with the invention includes an array of non-volatile memory cells divided into rows and columns. At least one column parasitic current control circuit is connected to a circuit for generating values of a depletion verify voltage and changing the values to suit the conditions of the memory device.

BRIEF DESCRIPTION OF THE DRAWINGS

The features and advantages of the re-programming method after an erase operation and the memory device according to the invention will become apparent from the following description of embodiments thereof, given by way of non-limiting examples, with reference to the accompanying drawings, in which.

DETAILED DESCRIPTION OF THE PREFERRED EMBODIMENTS

Figure 6:
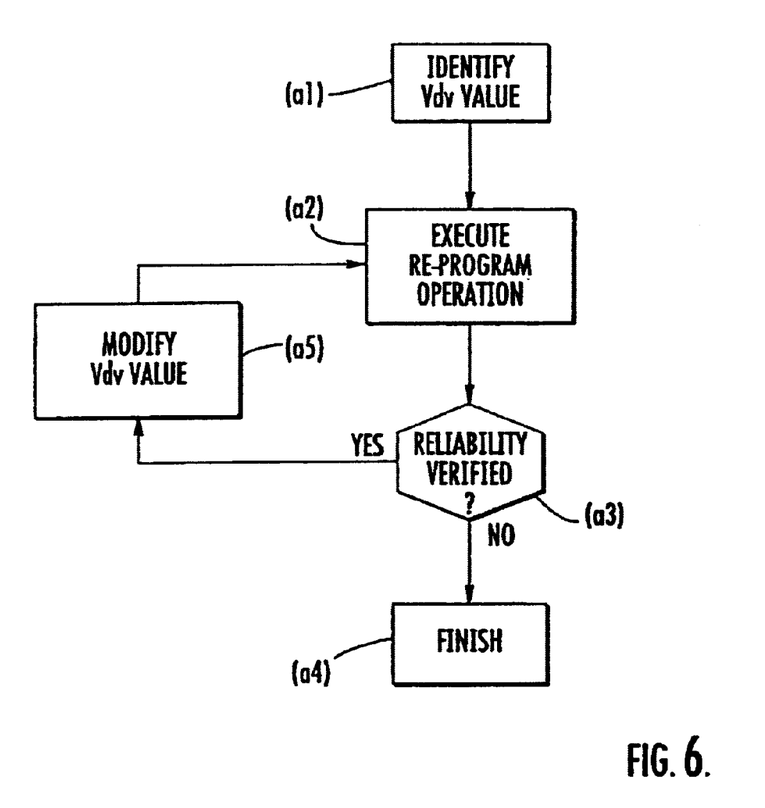
FIG. 6 is a flow chart illustrating a method of re-programming after an erase operation in accordance with the present invention.

With reference to the drawings, and in particular to FIG. 6, a method of re-programming a non-volatile memory after an erase operation by dynamic or adaptive handling of the depletion verify value setting is now described. It should be noted that the object of the re-program or soft program operation conventionally performed on memory devices after an erase operation is to set the non-volatile memory array, e.g., a NOR-configured memory, at a reliable working point. That is, a reliable working point is one that corresponds to a suitably limited leakage current of the cell columns. Setting the threshold voltage spread of the memory cells above the depletion verify value Vdv, as described above in connection with the prior art, is but one of the ways to achieve this goal.

According to the invention, the method of re-programming a NOR architecture non-volatile memory cell array of the Flash type occurs after an erase operation, where the erase operation has been executed conventionally. A first value of the depletion verify voltage Vdv is identified, at Block (a1), the re-program operation using the value of the depletion verify voltage Vdv is executed, at Block (a2), and the array of re-programmed cells for reliability in the read mode is verified, at Block (a3).

If the outcome of the array verifying step (Block (a3)) is favorable, i.e., no leakage current appears in the columns of the memory cells, the re-program operation is terminated, at Block (a4), as successful. Otherwise (i.e., if a non-trivial leakage current is detected in the memory cell columns), the method according to the invention advantageously includes modifying the value of the depletion verify voltage Vdv, at Block (a5), in particular to increase it. The re-programming method then continues with again executing the re-program operation using the modified depletion verify value (Block (a2)).

As such, the re-program operation is carried out at a value of the depletion verify voltage Vdv that has been adjusted automatically to meet the device conditions. In particular, it is preferably made "stricter" only if necessary. It should be noted that, the re-programming method according to the invention advantageously adjusts the situation of the depletion verify value Vdv to agree with the actual aging condition of the device. In contrast, this value is set beforehand in accordance with prior art methods based upon the maximum aging limit of the device, which may typically weaken its performance.

Furthermore, in accordance with the invention, a re-program operation may advantageously involve the entire array, after the erase operation and before the re-programming method is applied. This is to prepare the whole memory array for the re-program operations to follow. After an erase operation, the threshold voltage spread of the cells in a memory array is not statistically certain. Re-programming the entire array brings the spread back into a suitable range for subsequent operations to be performed.

Figure 7:
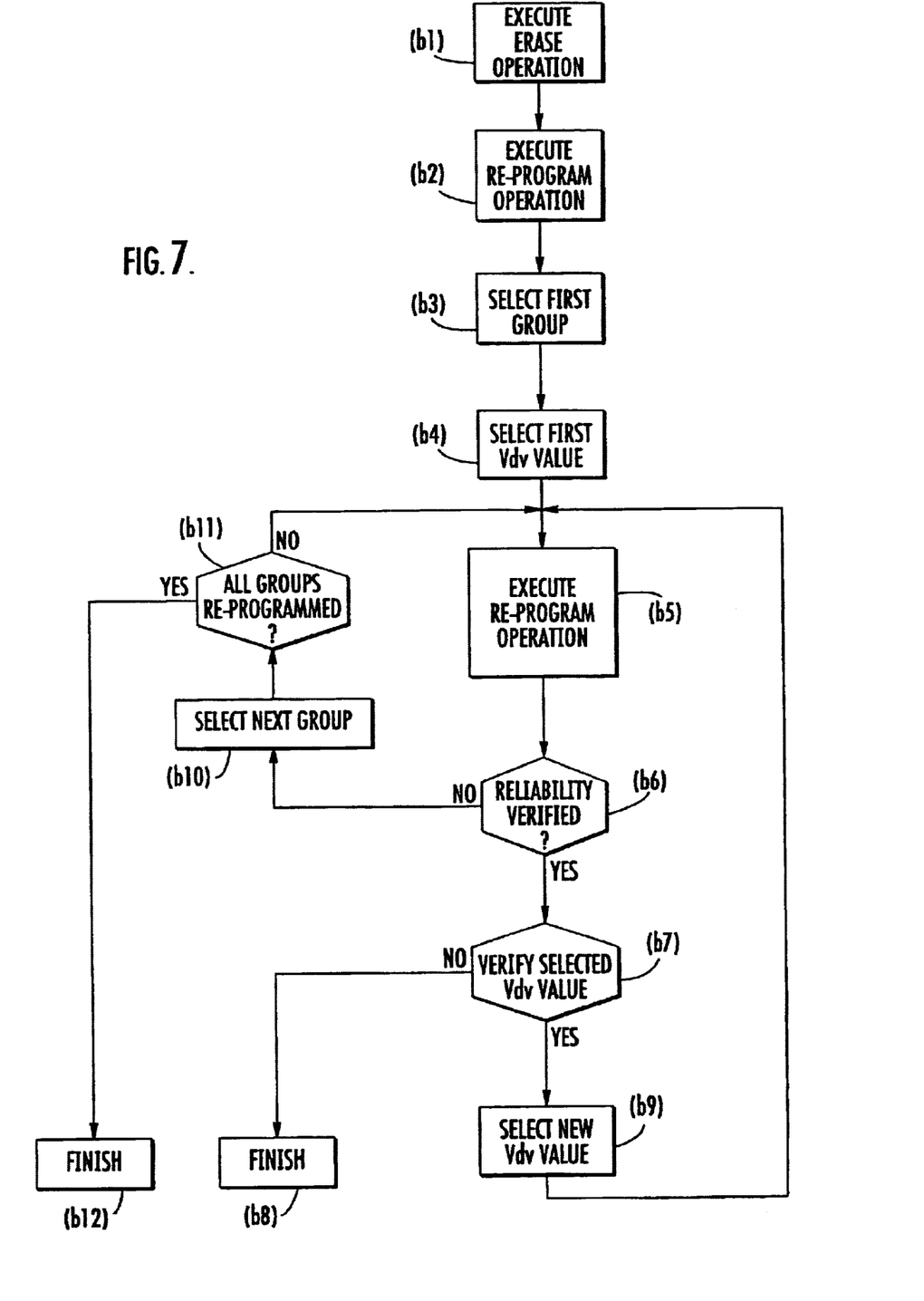
FIG. 7 is a flow chart illustrating an alternate embodiment of the method of re-programming after an erase operation of FIG. 6.

As illustratively shown in the diagram of FIG. 6, the entire re-program operation is carried out at each change of the depletion verify value Vdv. Turning now additionally to FIG. 7, a modified embodiment of the re-programming method after an erase operation according to the invention is now described which combines reliability and short execution time. In particular, the modification of the re-programming method illustrated in FIG. 7 splits the re-program operation between elementary units or groups of columns (typically, bytes or words, i.e. ×8 or ×16), and adds a step of verifying the depletion verify voltage value Vdv being used for sufficiency once each group of columns has been re-programmed.

In this way, should the depletion verify voltage value Vdv being used need to be changed, only a part of the array (typically, 1/256° or 1/128°) is re-programmed again, and the overall re-programming time is not significantly affected. In particular, this method of re-programming after an erase operation includes executing the erase operation, at Block (b1), executing a re-program operation involving the whole array, at Block (b2), and selecting a first group of columns for re-programming, at Block (b3).

A first depletion verify voltage value Vdv is selected, at Block (b4), and a re-program operation is executed (Block (b5)) using the selected depletion verify voltage value Vdv, row by row, involving the same number of cells as there are in the selected group of columns. Furthermore, the selected re-programmed group of columns is verified for reliability in the read mode, at Block (b6). In particular, this step essentially includes verifying the presence or absence of a non-trivial leakage current in the memory cell columns.

If the outcome of the array verifying step (Block (b6)) is unfavorable (i.e., a leakage current is detected in the memory cell column), the selected depletion verify value Vdv is verified (Block b7) to determine if it can be increased any further, where a maximum value has been set in advance for the depletion verify voltage value Vdv. If the outcome is favorable, a new value for the depletion verify voltage Vdv is selected, at Block (b9), and the group of columns still being used is re-programmed (Block (b5)). Otherwise, the re-programming method is terminated as unsuccessful (Block (b8)), since the maximum depletion verify value Vdv has been reached without the suppression of the leakage current having been accomplished.

Absent a non-trivial leakage current in the selected columns of memory cells, the method further includes selecting another group of columns, at Block (b10), and verifying if all the groups of columns have been already re-programmed, at Block (b11). If the outcome is favorable, the re-programming method is ended (Block (b12)) as successful. Otherwise, the newly selected group of columns is re-programmed (Block (B5)).

To summarize, throughout the device life, the re-programming method according to the invention will provide most of the cell re-programming at lower depletion verify voltage values Vdv than in the prior art devices. That is, such prior art devices use a value that has been set for the worst possible conditions of the memory device operation. As such, the present invention therefore may advantageously provide higher re-programming speed for a given degree of reliability of the memory devices, thus improving the performance of the devices.

In one embodiment, the different levels of the depletion verify voltage Vdv may be obtained using different reference cells. Other circuits could also be used, such as current generators or array/reference voltage unbalance circuits, which are known in the art.

The present discussion will now turn to how a non-volatile memory device may be modified to implement the re-programming method after an erase operation according to the invention. It should be noted that many of these modifications affect algorithms that are already provided and, accordingly, they need not cause any significant alteration in device size. Dedicated circuitry may be required only as far as controlling column parasitic current and generating depletion verify voltage levels is concerned. In all cases, the area occupied by such added circuitry is quite trivial compared to typical sizes of non-volatile Flash memory devices.

According to the invention, the non-volatile memory devices are advantageously provided with a mechanism designed to automatically vary the depletion verify voltage value Vdv to suit the conditions, i.e., the progression in age, of the devices. In this situation, the re-programming is tailored for the actual conditions of the device, which results in improved performance and reliability.

Figure 8:
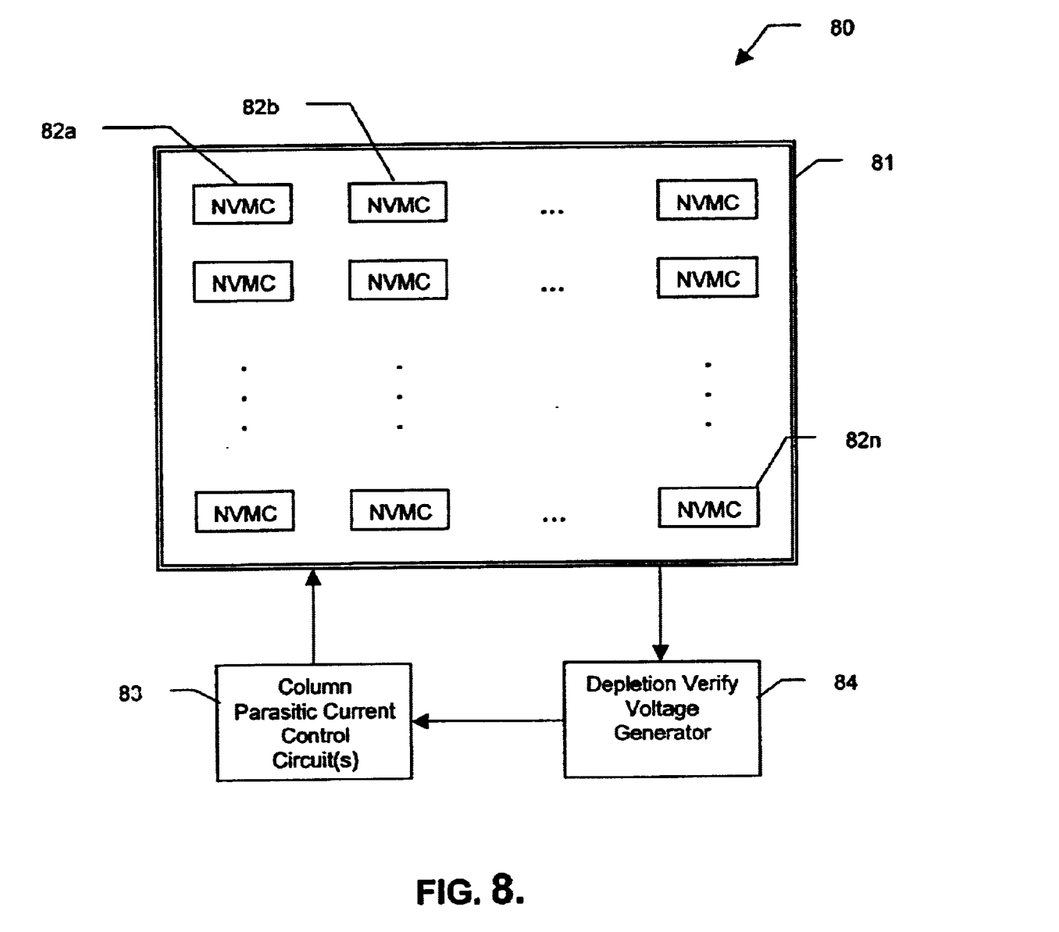
FIG. 8 is a schematic block diagram of a non-volatile memory device in accordance with the present invention.

More particularly, a non-volatile memory device 80 in accordance with the invention is illustratively shown in FIG. 8. The memory device 80 includes an array 81 of non-volatile memory cells 82a–82n divided into rows and columns, as illustratively shown. One or more column parasitic current control circuits 83 is connected to a circuit 84 for generating values of a depletion verify voltage and changing the values to suit the conditions of the memory device 80, as described above.

To summarize, the proposed re-programming method after an erase operation supports improved reliability and provides desired execution time of the re-program operation, this operation being advantageously executed at a depletion verify voltage value Vdv that is tailored to the device conditions. In this way, the same or, more likely, a better degree of reliability is achieved in the use of the memory array, along with a shorter re-programming time than is provided by prior art devices.

That which is claimed is:

1. A method of re-programming an array of non-volatile memory cells after an erase operation, the re-programming being executed after the erase operation to restore a threshold voltage of the memory cells to a higher value than a depletion verify voltage, the method comprising:

providing a value of the depletion verify voltage;

executing a re-program operation using the value of the depletion verify voltage;

verifying a reliability level of the array of re-programmed cells in a read mode;

if the reliability level is verified, terminating the re-program operation; and if the reliability level is not verified, modifying the value of the depletion verify voltage and executing the re-program operation again using the modified value of the depletion verify voltage.

2. The method according to claim 1 wherein the array is arranged in rows and columns; wherein verifying comprises detecting a leakage current in at least one column of the memory cells; and wherein the reliability level is not verified if a leakage current is detected.

3. The method according to claim 1 wherein modifying the value of the depletion verify voltage comprises increasing the value of the depletion verify voltage.

4. The method according to claim 1 wherein the memory cells are arranged in rows and columns, and wherein the re-program operation is split between groups of columns such that, if the value of the depletion verify voltage is modified, at least one of the groups of columns is not re-programmed using the modified value of the depletion verify voltage.

5. The method according to claim 4 wherein, prior to again executing the re-program operation using the modified value of the depletion verify voltage, the method further comprises selecting a group of columns to be re-programmed; and wherein executing comprises executing the re-program operation using the modified value of the depletion verify voltage row-by-row in the selected group of columns.

6. The method of claim 5 further comprising:

verifying the reliability level of the re-programmed cells in the selected group of columns in the read mode; and if the reliability level is not verified, increasing the depletion verify voltage if it has not already reached a maximum value.

7. The method according to claim 6 further comprising terminating re-programming if the maximum value has been reached.

8. The method according to claim 6 further comprising repeating selecting, executing, verifying, and modifying the value of the depletion voltage for the remaining groups of columns until each group has been re-programmed.

9. The method according to claim 1 wherein values of the depletion verify voltage are provided from reference memory cells.

10. The method according to claim 1 wherein executing the re-program operation comprises executing the re-program operation for the entire array of non-volatile memory cells.

11. A method of programming an array of non-volatile memory cells comprising:

erasing the memory cells;

providing a value of a depletion verify voltage;

re-programming at least some of the memory cells using the value of the depletion verify voltage;

verifying a reliability level of the re-programmed cells in a read mode;

if the reliability level is verified, terminating the re-program operation; and if the reliability level is not verified, modifying the value of the depletion verify voltage and executing the re-program operation again using the modified value of the depletion verify voltage.

12. The method according to claim 11 wherein the array is arranged in rows and columns; wherein verifying comprises detecting a leakage current in at least one column of the memory cells; and wherein the reliability level is not verified if a leakage current is detected.

13. The method according to claim 11 wherein modifying the value of the depletion verify voltage comprises increasing the value of the depletion verify voltage.

14. The method according to claim 11 wherein the memory cells are arranged in rows and columns, and wherein the re-program operation is split between groups of columns such that, if the value of the depletion verify voltage is modified, at least one of the groups of columns is not re-programmed using the modified value of the depletion verify voltage.

15. The method according to claim 11 wherein executing the re-program operation comprises executing the re-program operation for the entire array of non-volatile memory cells.

16. A non-volatile memory device comprising:

an array of non-volatile memory cells divided into rows and columns;

at least one first circuit connected to said array for controlling parasitic column current based upon a value of a depletion verify voltage; and at least one second circuit connected to said at least one first circuit for providing the value of the depletion verify voltage and modifying the value of the depletion verify voltage based upon a change in reliability of said array.

17. The memory device according to if claim 16 wherein the change in reliability comprises an increase in leakage current from at least one of said columns.

18. The memory device according to claim 17 wherein said at least one second circuit increases the value of the depletion verify voltage.

* * * * *